United States Patent
Lee et al.

(10) Patent No.: US 6,317,323 B1
(45) Date of Patent: Nov. 13, 2001

(54) HEAT SINK ASSEMBLY FOR AN ELECTRICAL SOCKET

(75) Inventors: Chao-Yang Lee, Taipei; Chao Kun Tseng, Tu-Chen; Chung-Tung Sun, Kee-Lung; Wei-Ta Lo, Miou-Li, all of (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/474,578

(22) Filed: Dec. 29, 1999

(30) Foreign Application Priority Data

Nov. 2, 1999 (TW) .............................. 88218637 U

(51) Int. Cl.[7] ...................................... H05K 7/20
(52) U.S. Cl. .......................................... 361/704; 257/719
(58) Field of Search ................... 165/80.3, 185; 174/16.3; 257/706, 707, 718, 719, 726, 727; 361/687, 703, 704, 715, 717–719; 24/453, 457, 458, 473, 625; 248/316.7, 505, 510

(56) References Cited

U.S. PATENT DOCUMENTS

| | | | |
|---|---|---|---|
| 5,594,624 | * | 1/1997 | Clemens . |
| 5,638,258 | * | 6/1997 | Lin . |
| 5,660,562 | * | 8/1997 | Lin . |
| 5,684,676 | * | 11/1997 | Lin . |
| 5,933,325 | * | 8/1999 | Hou . |
| 5,933,326 | * | 8/1999 | Lee . |

* cited by examiner

Primary Examiner—Gerald Tolin
(74) Attorney, Agent, or Firm—Wei Te Chung

(57) ABSTRACT

A heat sink assembly for an electrical socket of the present invention comprises a heat sink and a latching member latching with a pair of lugs on the socket. The heat sink comprises a base plate and a plurality of fins projecting upward therefrom. A receiving channel is integrally formed by a pressing means between the fins in the base plate for receiving the latching member. A pair of positioning pins depend downward from a bottom surface of the base plate to tightly engage in a slit between the electric socket and a CPU mounted thereon for positioning the heat sink assembly on the CPU and keeping it from moving along the CPU.

2 Claims, 3 Drawing Sheets

HEAT SINK ASSEMBLY FOR AN ELECTRICAL SOCKET

BACKGROUND OF THE INVENTION

The present invention relates to a heat sink assembly for an electrical socket, and particularly to a heat sink assembly which is effectively positioned and has a low cost.

Today's computer technology transmits information at higher and higher rates. As transmission speed increases, the heat produced by the internal electronic elements increases correspondingly. This heat must be dissipated efficiently, otherwise the rising temperature in the computer will cause a system malfunction.

Prior art Taiwan Patent Nos.85209788, 84218687and 83217100disclose heat sink assemblies having a heat sink body in contact with an electronic element. The heat sink body is formed from extruded aluminum and comprises a bottom glazed surface abutting the electronic element to absorb heat therefrom and a plurality of fins projecting upward from a base to dissipate the heat. A latching member closely binds the heat sink to the electronic element by latching to a pair of lugs formed on a socket mounting the electronic element. However, a channel must be cut in the heat sink body for receiving the latching member, which complicates the manufacture process. Additionally, the smooth, glazed surface of the heat sink abuts the electronic element, so the heat sink body is difficult to position accurately and may easily slide along the electric element after assembly. Hence, an improved electrical connector is required to overcome the disadvantages of the prior art.

BRIEF SUMMARY OF THE INVENTION

An essential object of the present invention is to provide a heat sink assembly which can be effectively positioned and has a low cost.

A heat sink assembly for an electrical socket of the present invention comprises a heat sink and a latching member. The heat sink comprises a base plate and a plurality of fins projecting upward from a top surface thereof. A receiving channel is integrally formed between the plurality of fins for receiving the latching member. The base plate defines an enlarged recess adjacent to the receiving channel to prevent interference with the normal operation of the electric socket. A pair of positioning pins depend downward from a bottom surface of the base plate for positioning the heat sink on a CPU mounted on the electric socket and keeping it from moving along the CPU.

Other objects, advantages and novel features of the invention will become more apparent from the following detailed description of the present embodiment when taken in conjunction with the accompanying drawings.

DETAILED DESCRIPTION OF THE INVENTION

Figure 1:
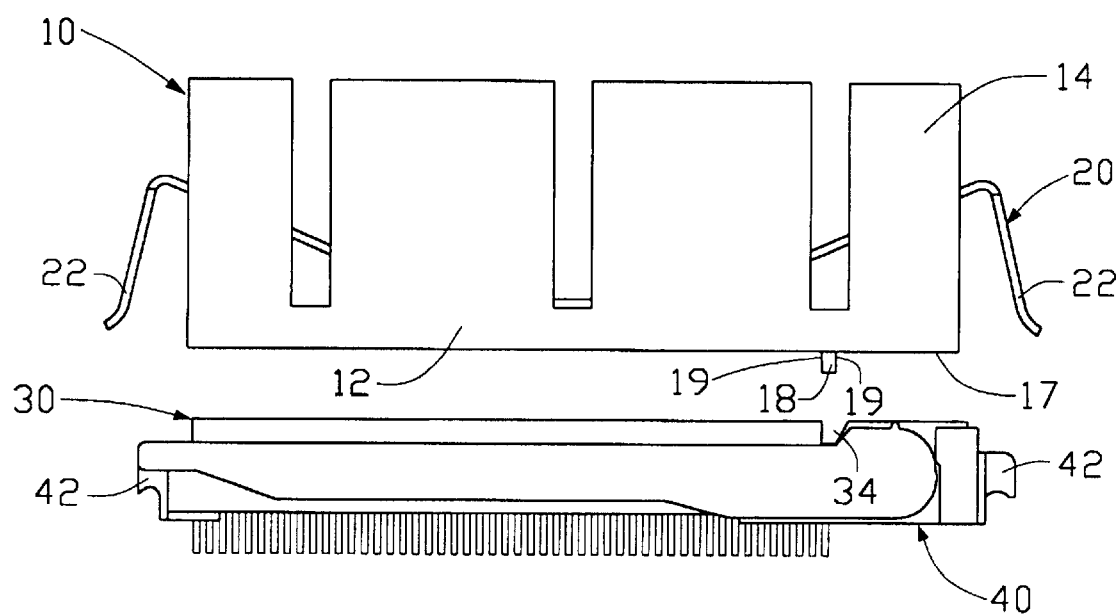
FIG. 1 is a front view of a heat sink assembly of the present invention with a CPU mounted on an electrical socket.
Figure 2:
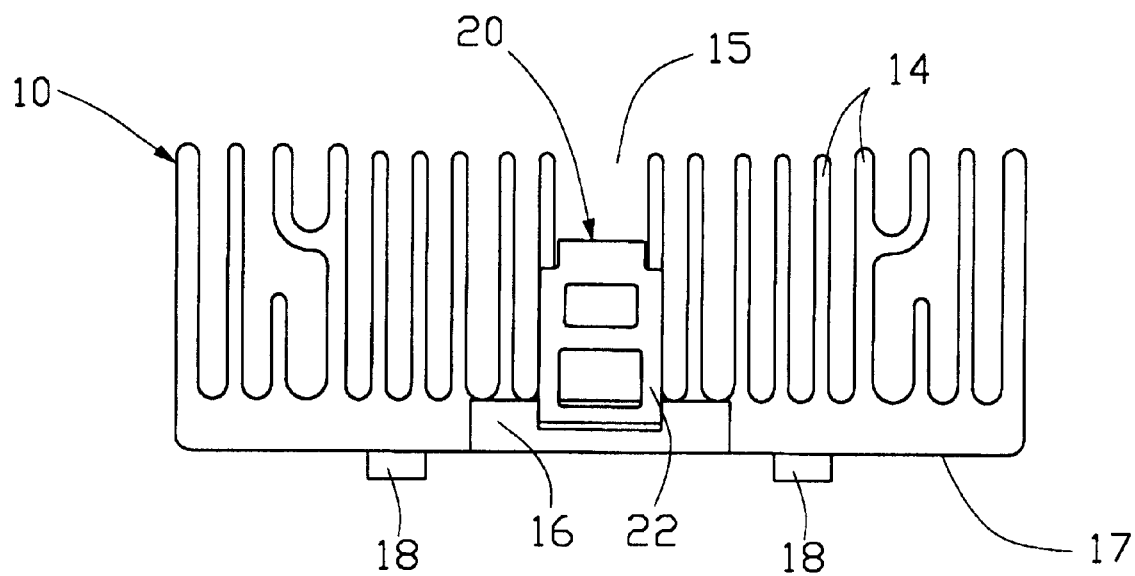
FIG. 2 is a right side view of a heat sink assembly of the present invention.
Figure 3:
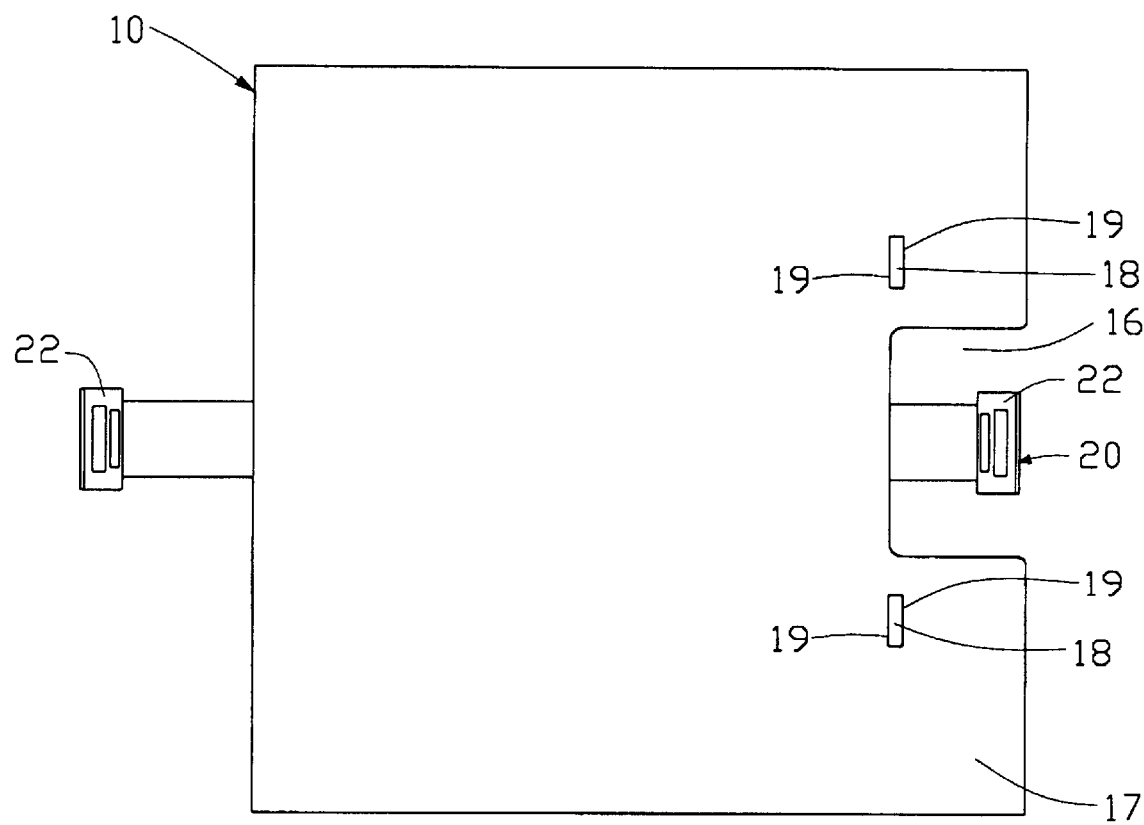
FIG. 3 is a bottom view of a heat sink assembly of the present invention.

Referring to FIGS. 1 to 3, a heat sink assembly for an electrical socket of the present invention comprises a heat sink 10 and a latching member 20. The heat sink 10 is formed by extruding aluminum and comprises a base plate 12 and a plurality of fins 14 integral with the base plate 12 and projecting upward from a top surface thereof. A receiving channel 15 is integrally press-formed between the plurality of fins 14 in the base plate 12 for receiving the latching member 20, thereby simplifying the manufacture of the heat sink with respect to the prior art, which formed a receiving channel using a cutting means. The base plate 12 comprises a bottom glazed surface 17 for abutting a CPU 30 to absorb the heat produced by the CPU 30. As best seen in FIG. 3, an enlarged recess 16 is defined at one side of the base plate 12 adjacent to the receiving channel 15 to prevent interference with the normal operation of an electrical socket 40 to which the heat sink assembly is fastened. A pair of positioning pins 18 depend downward from the bottom surface 17 at both sides of the recess 16, each pin 18 forming a pair of side abutting surfaces 19. The latching member 20 has a curved shape and comprises a pair of latching arms 22 depending downward at each side of a middle section (not labeled) thereof.

The CPU 30 is mounted on an electrical socket 40, a slit 34 being defined therebetween which engages with the pair of positioning pins 18. The electrical socket 40 forms a pair of lugs 42 at opposite sides thereof to latch with the pair of latching arms 22 of the latching member 20. One of said lugs 42 is formed on the socket 40 nearest to and parallel to the slit 34.

In assembly, the latching member 20 is engaged in the receiving channel 15 of the heat sink 10. The heat sink assembly is placed atop the CPU 30, the pair of positioning pins 18 fitting in the slit 34 with each pair of side surfaces 19 thereof abutting against both inside surfaces (not labeled) of the slit 34. The heat sink assembly is then fastened to the electrical socket 40 by the pair of latching arms 22 latching the pair of lugs 42 of the electrical socket 40, the bottom surface 17 abutting the CPU 30 to absorb heat produced therefrom. The heat sink 10 is thereby securely positioned and is kept from moving along the CPU 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A combination of a heat sink assembly comprising:

a socket forming a pair of lugs respectively on front and rear faces thereof;

a CPU positioned on the socket;

a heat sink including a base plate abutting against a top surface of the CPU, and at least one positioning pin extending downward from the base plate and confronting a front edge of the CPU, a recess being defined at one side of the base plate adjacent the positioning pin; and a latching member comprising a pair of latching arms latchably engaged with the pair of lugs for fastening the socket, the CPU and the heat sink together; wherein the recess of the heat sink receives the latching member.

2. The combination as claimed in claim 1, wherein said positioning pin is positioned between the CPU and the socket for confinement in a front-to-back direction.

* * * * *